(12) United States Patent
Amanuma et al.

(10) Patent No.: US 7,471,092 B2
(45) Date of Patent: Dec. 30, 2008

(54) TEST APPARATUS AND TEST METHOD

(75) Inventors: Seiji Amanuma, Tokyo (JP); Ken-ichiro Hatake, Tokyo (JP)

(73) Assignee: Advantest Corporation, Tokyo (JP)

( * ) Notice: Subject to any disclaimer, the term of this patent is extended or adjusted under 35 U.S.C. 154(b) by 97 days.

(21) Appl. No.: 11/698,773

(22) Filed: Jan. 26, 2007

(65) Prior Publication Data

US 2007/0194795 A1 Aug. 23, 2007

(30) Foreign Application Priority Data

Jan. 31, 2006 (JP) ............................. 2006-023272

(51) Int. Cl.
*G01R 31/08* (2006.01)
*G01R 31/26* (2006.01)

(52) U.S. Cl. ..................... 324/522; 324/523; 324/765

(58) Field of Classification Search ................. 324/522, 324/523, 537, 765
See application file for complete search history.

(56) References Cited

U.S. PATENT DOCUMENTS

| | | | |
|---|---|---|---|
| 5,200,696 A * | 4/1993 | Menis et al. ............. | 324/158.1 |
| 6,498,473 B1 * | 12/2002 | Yamabe ................... | 324/765 |
| 7,049,850 B2 * | 5/2006 | Shimizu ................... | 326/100 |
| 2005/0144539 A1 * | 6/2005 | Orita ....................... | 714/48 |

* cited by examiner

*Primary Examiner*—Timothy J Dole
(74) *Attorney, Agent, or Firm*—Osha-Liang LLP

(57) ABSTRACT

A test apparatus to test a device under test (DUT) to which a reference voltage of a predetermined high voltage is supplied is provided. The test apparatus includes a reference voltage applying section that applies the reference voltage to the DUT, wherein the reference voltage defines a voltage level that is to be possessed by an output signal output from the DUT when the output signal indicates a predetermined logical value, a voltage level detecting section that detects a voltage level of the reference voltage, a signal comparing section that compares the output signal with an expected value signal, a reference voltage comparing section that judges whether the voltage level of the reference voltage detected by the voltage level detecting section falls within a predetermined expected voltage range, and a judging section that judges whether the DUT is good or bad based on a result of the comparison done by the signal comparing section, under a condition that the voltage level of the reference voltage falls within the expected voltage range.

9 Claims, 6 Drawing Sheets

236

32

38

TEST APPARATUS AND TEST METHOD

CROSS REFERENCE TO RELATED APPLICATION

The present application claims priority from a Japanese Patent Application(s)NO. 2006-023272 filed on Jan. 31, 2006, the contents of which are incorporated herein by reference.

BACKGROUND

1. Technical Field

The present invention relates to a test apparatus and a test method to test a device under test (DUT). More particularly, the present invention relates to a test apparatus and a test method to test a DUT to which a reference voltage of a predetermined high voltage is supplied.

2. Related Art

In recent years, the demand for High Voltage Integrated Circuit (HVIC) that outputs a signal with a high voltage has been on the rise. The HVIC is used in a motor controlling device of an electric vehicle, for example.

The HVIC is a device outputting a signal that has a predetermined amplitude with, for example, approximately 0 to 2 kV being used as a reference voltage level. To test the HVIC, a test apparatus supplies a reference voltage of a high voltage (approximately 0 to 2 kV) to the HVIC. Here, the test apparatus detects a data pattern of the output signal and judges whether the device under test (DUT) is good or bad based on the data pattern.

If the test apparatus does not apply a normal reference voltage to the HVIC, the test apparatus can not accurately measure the level of the output signal from the HVIC. A conventional test apparatus does not have means for measuring a reference voltage of a high voltage, and therefore can not accurately test a DUT. As such means for measuring a high voltage, a comparator or the like which can withstand a high voltage is additionally required. This indicates a high cost.

In view of the above, an advantage of some embodiments of the present invention is to provide a test apparatus and a test method which can solve the above problem. This advantage is achieved by combining the features recited in the independent claims. The dependent claims define further effective specific example of the present invention.

SUMMARY

To solve the foregoing problem, a first embodiment of the present invention provides a test apparatus to test a device under test (DUT) to which a reference voltage of a predetermined high voltage is supplied. The test apparatus includes a reference voltage applying section that applies the reference voltage to the DUT, wherein the reference voltage defines a voltage level that is to be possessed by an output signal output from the DUT when the output signal indicates a predetermined logical value, a voltage level detecting section that detects a voltage level of the reference voltage, a signal comparing section that compares the output signal with an expected value signal, a reference voltage comparing section that judges whether the voltage level of the reference voltage detected by the voltage level detecting section falls within a predetermined expected voltage range, and a judging section that judges whether the DUT is good or bad based on a result of the comparison done by the signal comparing section, under a condition that the voltage level of the reference voltage falls within the expected voltage range.

The voltage level detecting section may detect the voltage level of the reference voltage based on an input terminal of the DUT into which the reference voltage is input. The DUT may include a low voltage operating section, and a high voltage operating section that operates at a higher voltage than the low voltage operating section. The test apparatus may further include a low voltage applying section that applies a first reference voltage to the low voltage operating section, the reference voltage applying section may apply, to the high voltage operating section, a second reference voltage which has a higher voltage level than the first reference voltage by a predetermined difference, the voltage level detecting section may detect a voltage level of the second reference voltage, and the reference voltage comparing section may judge whether the voltage level of the second reference voltage falls within the expected voltage range.

The test apparatus may further include a plurality of logic pins that judge logical values of signals respectively input thereto, wherein each of the plurality of logic pins includes therein a comparator that compares a voltage level of the input signal with a threshold value supplied thereto and outputs a result of the comparison. Here, the high voltage operating section may output the output signal which uses the second reference voltage as a reference, a first logic pin included in the plurality of logic pins may be supplied with the output signal output from the high voltage operating section, a second logic pin included in the plurality of logic pins may be supplied with the second reference voltage, and the test apparatus may further include a control section that causes a comparator of the second logic pin to function as the voltage level detecting section by sequentially varying a threshold value supplied to the comparator of the second logic pin.

The test apparatus may further include a switching section that switches an input into the voltage level detecting section between the output signal output from the high voltage operating section and the second reference voltage output from the reference voltage applying section.

The test apparatus may further include a signal voltage dividing section that divides, with a predetermined voltage dividing ratio, a voltage level of the output signal output from the high voltage operating section, a reference voltage dividing section that divides, with the voltage dividing ratio, the voltage level of the second reference voltage output from the reference voltage applying section, and a differential amplifier that amplifies, with an amplifying ratio determined in accordance with the voltage dividing ratio, a difference between the voltage level of the output signal output from the signal voltage dividing section and the voltage level of the second reference voltage output from the reference voltage dividing section and outputs a result of the amplification. Here, the switching section may switch the input into the voltage level detecting section between a signal output from the differential amplifier and the second reference voltage output from the reference voltage dividing section.

The test apparatus may further include a switching control section that (i) controls the switching section so as to input the second reference voltage into the voltage level detecting section, and (ii) when the reference voltage comparing section judges that the second reference voltage falls within the expected voltage range, controls the switching section so as to pass therethrough the output signal output from the high voltage operating section.

The test apparatus may further include a pattern generating section that generates a test pattern to be input into the DUT based on a test program supplied thereto, and a switching control section that (i) detects, based on the test program, a timing at which the output signal from the high voltage operating section is not compared with the expected value signal, and (ii) at the detected timing, controls the second reference voltage so as to be input into the voltage level detecting section.

A second embodiment of the present invention provides a test method to test a device under test (DUT). The test method includes applying the reference voltage to the DUT, wherein the reference voltage defines a voltage level that is to be possessed by an output signal output from the DUT when the output signal indicates a predetermined logical value, detecting a voltage level of the reference voltage, comparing the output signal with an expected value signal, judging whether the voltage level of the reference voltage detected in the voltage level detecting falls within a predetermined expected voltage range, and judging whether the DUT is good or bad based on a result of the comparison done in the signal comparing, under a condition that the voltage level of the reference voltage falls within the expected voltage range.

Here, all the necessary features of the present invention are not listed in the summary. The sub-combinations of the features may become the invention.

DESCRIPTION OF EXEMPLARY EMBODIMENTS

Hereinafter, one aspect of the present invention will be described based on some embodiments of the present invention. The embodiments do not limit the invention according to the claims, and all the combinations of the features described in the embodiments are not necessarily essential to means provided by aspects of the invention.

Figure 1:
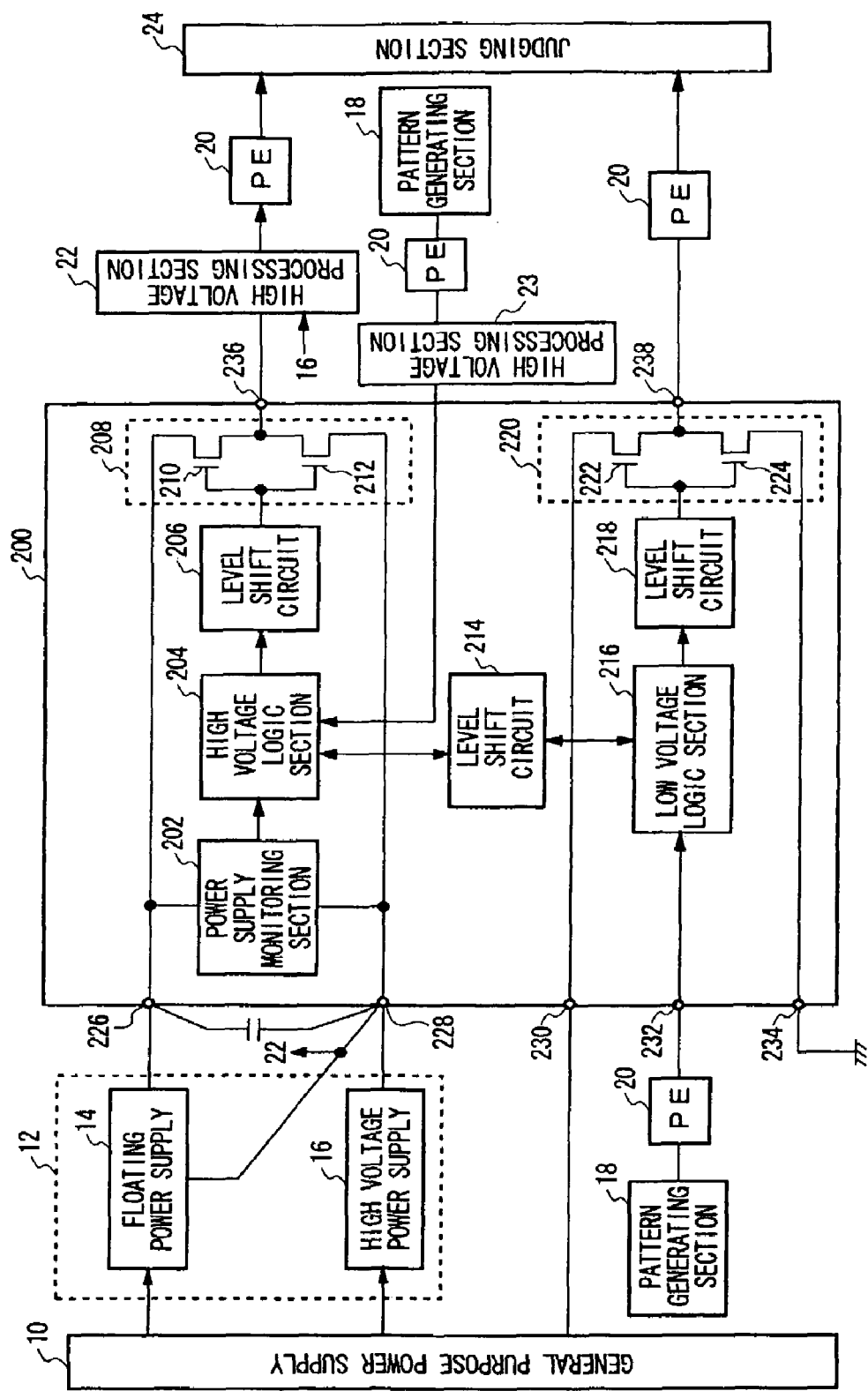
FIG. 1 shows an example of the configuration of a test apparatus 100 relating to an embodiment of the present invention.

FIG. 1 shows an example of the configuration of a test apparatus 100 relating to an embodiment of the present invention. The test apparatus 100 tests a device under test (DUT) 200 such as a semiconductor circuit. The DUT 200 is supplied with a reference voltage of a predetermined high voltage. The DUT 200 outputs a first output signal having a waveform in which, for example, a ground potential is used as a reference, and a second output signal having a waveform in which, for example, a high voltage of approximately 0 to 2 kV is used as a reference. The DUT 200 includes therein a power supply monitoring section 202, a high voltage logic section 204, a level shift circuit 206, a high voltage operating section 208, a level shift circuit 214, a low voltage logic section 216, a level shift circuit 218, a low voltage operating section 220, and a plurality of input/output pins (226 to 238).

The input/output pins 234 and 230 are supplied with voltages which use a first reference voltage as a reference. According to the present embodiment, the first reference voltage is a ground potential. The input/output pin 234 is supplied with the ground potential, and the input/output pin 230 is supplied with a voltage having a predetermined potential difference when compared to the ground potential.

The low voltage operating section 220 includes therein transistors 222 and 224. The low voltage operating section 220 outputs the first output signal via the input/output pin 238. Furthermore, the low voltage operating section 220 is supplied with the voltages applied to the input/output pins 234 and 230, and outputs the first output signal having an amplitude determined in accordance with the difference in voltage level between the voltages. For example, the low voltage operating section 220 is supplied with the voltage applied to the input/output pin 230 as the voltage level of the first output signal presented when the first output signal indicates an H logic, and supplied with the voltage applied to the input/output pin 234 as the voltage level of the first output signal presented when the first output signal indicates an L logic.

The input/output pin 232 is supplied with a test pattern. The low voltage logic section 216 controls the gate voltages input into the gate terminals of the transistors 222 and 224 based on the supplied test pattern. In this way, the low voltage operating section 220 outputs the first output signal in response to the test pattern. The level shift circuit 218 shifts the voltage levels of the gate voltages output from the low voltage logic section 216 so as to correspond to the characteristics of the transistors 222 and 224.

The input/output pins 226 and 228 are supplied with voltages which use a second reference voltage as a reference. The second reference voltage has a higher voltage level than the first reference voltage by a predetermined difference. According to the present embodiment, the input/output pin 228 is supplied with the second reference voltage of approximately 0 to 2 kV. The input/output pin 226 is supplied with a voltage having a predetermined difference in voltage level when compared to the second reference voltage.

The high voltage operating section 208 includes therein transistors 210 and 212. The high voltage operating section 208 outputs the second output signal via the input/output pin 236. Furthermore, the high voltage operating section 208 is supplied with the voltages applied to the input/output pins 226 and 228, and outputs the second output signal having an amplitude determined in accordance with the difference in voltage level between the voltages.

The high voltage logic section 204 controls the gate voltages input into the gate terminals of the transistors 210 and 212 based on the test pattern input into the DUT 200. In this way, the high voltage operating section 208 outputs the second output signal in response to the test pattern.

The test pattern may be supplied to the high voltage logic section 204 via the input/output pin 232, low voltage logic section 216 and level shift circuit 214. In this case, the level shift circuit 214 shifts the voltage level of the test pattern by an amount determined in accordance with the difference in voltage level between the first and second reference voltages. The test pattern may be supplied to the high voltage logic section 204 in a different path which does not include the low voltage logic section 216. The level shift circuit 206 shifts the voltage levels of the gate voltages output from the high voltage logic section 204 so as to correspond to the characteristics of the transistors 210 and 212.

The test apparatus 100 includes therein a general purpose power supply 10, a reference voltage applying section 12, a pattern generating section 18, a pin electronics section 20, a high voltage processing section 22, a high voltage processing section 23, and a judging section 24. The general purpose power supply 10 generates a power to cause the test apparatus 100 to operate. According to the present embodiment, the general purpose power supply 10 functions as a low voltage applying section that generates a voltage which uses the first reference voltage as a reference and applies the generated voltage to the input/output pin 230. While the input/output pin 234 is connected to the ground potential in the present embodiment, the general purpose power supply 10 may apply the first reference voltage of a predetermined voltage to the input/output pin 234 in another embodiment. With the above-described configuration, the general purpose power supply 10 can apply a power supply voltage to the low voltage operating section 220 of the DUT 200.

The reference voltage applying section 12 generates voltages which use the second reference voltage as a reference, and applies the generated voltages to the input/output pins 226 and 228. For example, the reference voltage applying section 12 applies a voltage of approximately 0 to 2 kV to the input/output pin 228, and applies, to the input/output pin 226, a voltage of approximately 15 V which uses the voltage applied to the input/output pin 228 as a reference.

The reference voltage applying section 12 includes therein a high voltage power supply 16 and a floating power supply 14. The high voltage power supply 16 generates the second reference voltage and applies the second reference voltage to the input/output pin 228. The floating power supply 14 generates a voltage which uses as a reference the second reference voltage output from the high voltage power supply 16, and applies the generated voltage to the input/output pin 226. With the above-described configuration, the reference voltage applying section 12 can apply a power supply voltage having a high voltage level to the high voltage operating section 208 of the DUT 200.

The pin electronics section 20 includes therein a plurality of logic pins in correspondence with the plurality of input/output pins (226 to 238) of the DUT 200. Each of the logic pins is electrically connected to a corresponding one of the input/output pins 226 to 238. The signals, power and the like are exchanged between the test apparatus 100 and the DUT 200 via the logic pins of the pin electronics section 20. In FIG. 1, the pin electronics section 20 is shown as more than one separate constituent. However, the logic pins of the pin electronics section 20 may be all disposed on the single substrate.

The pattern generating section 18 generates a test pattern and inputs the generated test pattern into the DUT 200. The pattern generating section 18 may generate the test pattern based on a test program which is supplied thereto in advance.

The high voltage processing sections 22 and 23 are provided between the DUT 200 and pin electronics section 20. The high voltage processing section 22 receives the output signal output from the high voltage operating section 208, and processes the received output signal so as to correspond to the characteristics of the pin electronics section 20. For example, the high voltage processing section 22 shifts the signal level of the output signal to a signal level corresponding to a voltage a corresponding one of the logic pins of the pin electronics section 20 can withstand. In this way, the test apparatus 100 can detect the data of the output signal with a high voltage, even when the pin electronics section 20 can not withstand a high voltage.

On the other hand, the high voltage processing section 23 receives the test pattern generated by the pattern generating section 18, and processes the received test pattern so as to correspond to the characteristics of the high voltage logic section 204. For example, the high voltage processing section 23 may shift the voltage level of the test pattern by an amount determined in accordance with the difference in voltage level between the first and second reference voltages, similarly to the level shift circuit 214.

The judging section 24 judges whether the DUT 200 is good or bad based on the output signal output from the DUT 200. For example, the judging section 24 may make the judgment by judging whether the data patterns of the output signals output from the low voltage operating section 220 and/or high voltage operating section 208 match the data pattern of the expected value signal supplied thereto. In this case, the expected value signal may be generated by the pattern generating section 18 based on the test program.

The judging section 24 also judges whether the second reference voltage output from the high voltage power supply 16 falls within a predetermined expected voltage range. The judging section 24 makes the judgment whether the DUT 200 is good or bad based on the output signals, under the condition that the voltage level of the second reference voltage falls within the expected voltage range. With the above-described configuration, the test apparatus 100 can accurately judge whether the DUT 200, to which a high voltage is supplied, is good or bad.

The judging section 24 detects the voltage level of the second reference voltage on the transmission path between the high voltage power supply 16 and input/output pin 228. In this case, it is preferable that the judging section 24 detects the voltage level of the second reference voltage based on the input terminal of the DUT 200 (the input/output pin 228) into which the second reference voltage is input.

The power supply monitoring section 202 monitors the voltages supplied to the input/output pins 226 and 228. When the voltages do not fall within a predetermined voltage range, the power supply monitoring section 202 may stop the high voltage logic section 204 from operating. The power supply monitoring section 202 may also monitor whether the difference between the voltages applied to the input/output pins 226 and 228 falls within a predetermined voltage range.

Figure 2:
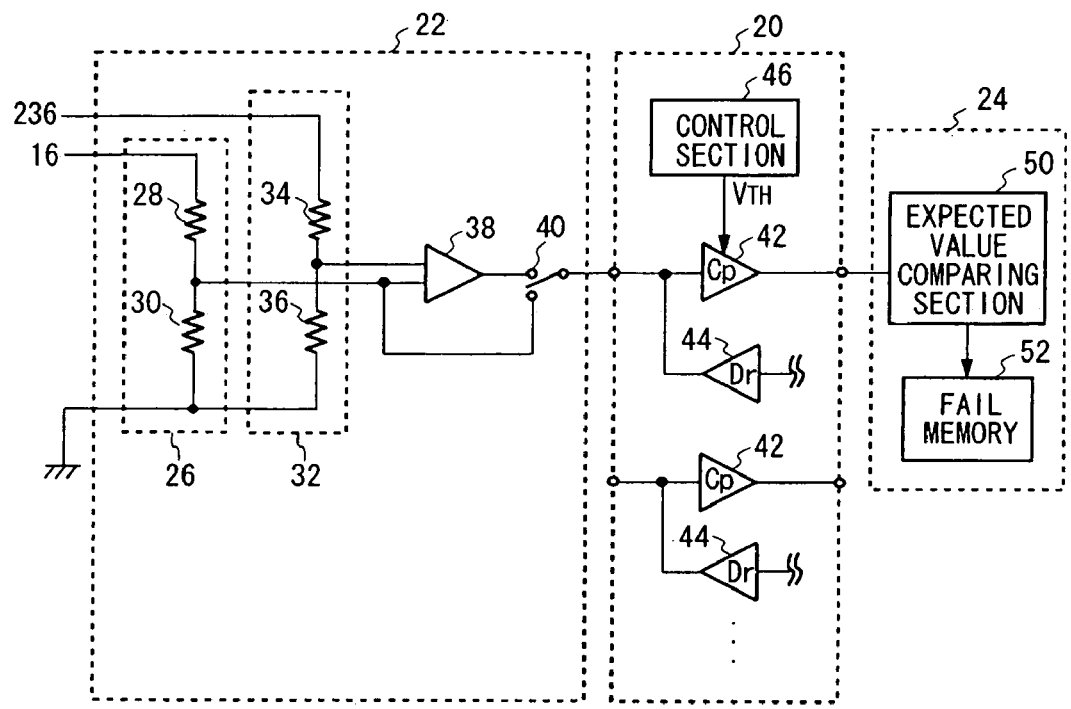
FIG. 2 shows, as an example, the configurations of a high voltage processing section 22, a pin electronics section 20 and a judging section 24.

FIG. 2 shows, as an example, the configurations of the high voltage processing section 22, pin electronics section 20 and judging section 24. The high voltage processing section 22 includes therein a signal voltage dividing section 32, a reference voltage dividing section 26, a differential amplifier 38, and a switching section 40. The signal voltage dividing section 32 divides the voltage level of the output signal output from the high voltage operating section 208 with a predetermined voltage dividing ratio. The signal voltage dividing section 32 includes therein two resistances 34 and 36 provided in series between the input/output pin 236 and ground potential. The signal voltage dividing section 32 divides the voltage of the output signal in accordance with the resistance ratio between the resistances 34 and 36, and outputs the voltage divided signal. For example, the signal voltage dividing section 32 divides the voltage level of the output signal by approximately 200, and outputs the voltage divided signal.

The reference voltage dividing section 26 divides the voltage level of the second reference voltage output from the reference voltage applying section 12, with a voltage dividing ratio substantially the same as the voltage dividing ratio of the signal voltage dividing section 32. The reference voltage dividing section 26 includes therein resistances 28 and 30 provided in series between the high voltage power supply 16 and ground potential. The reference voltage dividing section 26 divides the voltage level of the second reference voltage in accordance with the resistance ratio between the resistances 28 and 30, and outputs the voltage divided signal.

The differential amplifier 38 amplifies the difference in voltage level between the output signal output from the signal voltage dividing section 32 and the second reference voltage output from the reference voltage dividing section 26 with an amplification ratio determined in accordance with the voltage dividing ratio, and outputs the result of the amplification. For example, the differential amplifier 38 amplifies the amplitude of the difference by approximately 200, and outputs the result of the amplification. With the above-described configuration, the high voltage processing section 22 can eliminate the high voltage component from the output signal which uses a high voltage as a reference, to extract a low voltage signal component. As a result, the test apparatus 100 can detect the signal component of the output signal with the use of a circuit that can withstand a low voltage.

The switching section 40 switches the input into the pin electronics section 20 between the output signal output from the high voltage operating section 208 and the second reference voltage output from the reference voltage applying section 12. In this way, one of the output signal and second reference voltage can be selected as a signal to be measured, and input into the pin electronics section 20.

Furthermore, the switching section 40 relating to the present embodiment switches the input into the pin electronics section 20 between the signal output from the differential amplifier 38 and the second reference voltage output from the reference voltage dividing section 26. In other words, the switching section 40 switches the input into the pin electronics section 20 between the output signal from which a high voltage component has been eliminated and the voltage divided second reference voltage. In this way, the pin electronics section 20 can measure the input signal without logic pins that can withstand a high voltage.

The pin electronics section 20 includes therein a comparator 42 and a driver 44 in each of the logic pins thereof. The comparator 42 compares the voltage level of the input signal with a predetermined threshold value and outputs a result of the comparison. For example, the comparator 42 outputs a logical value of 1 when the voltage level of the input signal is equal to or larger than the threshold value, and outputs a logical value of 0 when the voltage level of the input signal is smaller than the threshold value. The driver 44 shapes a signal of a predetermined voltage level based on the test pattern, for example, and inputs the signal into the DUT 200.

According to the present embodiment, the switching section 40 switches the input into a corresponding one of the comparators 42 between the signal output from the differential amplifier 38 and the second reference voltage output from the reference voltage dividing section 26. When. supplied with the signal output from the differential amplifier 38, the comparator 42 converts the signal into a binary signal based on the threshold value and outputs the binary signal. In this case, the judging section 24 compares the signal output from the comparator 42 with the expected value signal, to judge whether the DUT 200 is good or bad.

On the other hand, when supplied with the second reference voltage, the comparator 42 functions as a voltage level detecting section that detects the voltage level of the second reference voltage. In this case, with the threshold value supplied to the comparator 42 being sequentially varied, the comparator 42 makes the comparison based on each threshold value. The comparator 42 can detect the voltage level of the second reference voltage with reference to the result of the comparison based on each threshold value. In this case, the judging section 24 judges whether the reference voltage applying section 12 is good or bad based on the voltage level of the second reference voltage which is detected by the comparator 42. Here, the test apparatus 100 may further include therein a control section 46 to control the above-mentioned threshold value. The control section 46 may independently control the threshold value supplied to each comparator 42. The control section 46 may be provided inside or outside the pin electronics section 20.

The judging section 24 includes therein an expected value comparing section 50 and a fail memory 52. The expected value comparing section 50 judges whether the DUT 200 is good or bad, or whether the reference voltage applying section 12 is good or bad based on the signal output from the comparator 42.

The expected value comparing section 50 compares the signal output from the comparator 42 with the expected value, to judge whether the DUT 200 or reference voltage applying section 12 is good or bad. For example, when the output signal is supplied to the comparator 42, the expected value comparing section 50 functions as a signal comparing section that compares the data of the output signal with the data of the expected value signal so as to judge whether the DUT 200 is good or bad.

When the second reference voltage is supplied to the comparator 42, the expected value comparing section 50 functions as a reference voltage comparing section that judges whether the voltage level of the second reference voltage falls within the expected voltage range so as to judge whether the reference voltage applying section 12 is good or bad.

Here, the test apparatus 100 may judge whether the expected value comparing section 50 is normal first of all. Under the condition that the expected value comparing section 50 is normal, the test apparatus 100 may judge whether the DUT 200 is normal based on the output signal.

With the above-described configuration, when the reference voltage applying section 12 is broken, the test apparatus 100 can be prevented from erroneously judging a defective device to be a good device, or from making measurement based on an erroneous test condition. In addition, the test apparatus 100 can measure both the reference voltage and the output signal with the single comparator 42, to achieve effective use of the pin resource. Furthermore, since the test apparatus 100 measures the output signal which uses a high voltage as a reference and the reference voltage of a high voltage after voltage division, the comparators 42 in the test apparatus 100 are not required to have a capability to withstand a high voltage. This means that each comparator 42 can be commonly used for measuring the high and low voltages, which realizes effective utilization of the pin resource.

Figure 3:
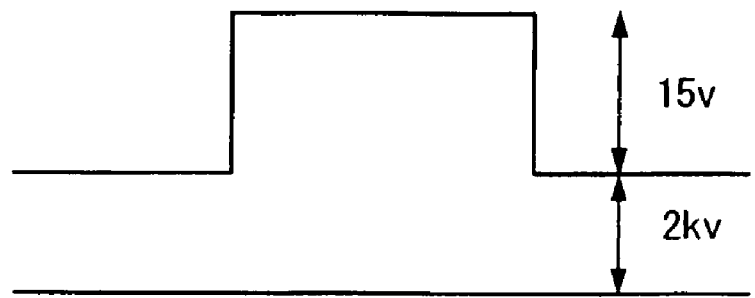
FIG. 3 shows, as an example, the waveforms of an output signal output from a high voltage operating section 208, an output signal output from a signal voltage dividing section 32, and an output signal output from a differential amplifier 38.
Figure 3:
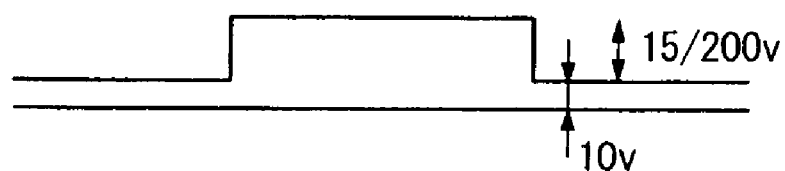
Figure 3:
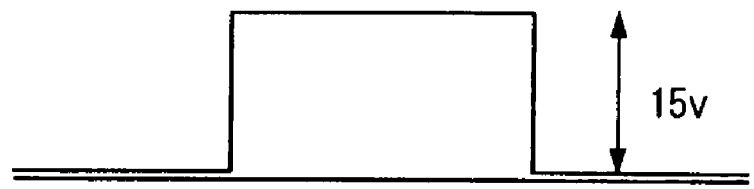

FIG. 3 shows, as an example, the waveforms of the output signal output from the high voltage operating section 208, the output signal output from the signal voltage dividing section 32 and the output signal output from the differential amplifier 38. As mentioned above, the output signal output from the high voltage operating section 208 has an amplitude of approximately 15 with the reference voltage being set to a high voltage of approximately 0 to 2 kV.

The signal voltage dividing section 32 divides the voltage of the output signal with the predetermined voltage dividing ratio and outputs the voltage divided signal as mentioned above. In this way, the signal voltage dividing section 32 can reduce the voltage level of the output signal.

The differential amplifier 38 amplifies the difference between the voltage divided output signal and second reference voltage with an amplification ratio determined in accordance with the above voltage dividing ratio and outputs a result of the amplification as mentioned above. As shown in FIG. 3, when the signal voltage dividing section 32 divides the voltage of the output signal and outputs the voltage divided output signal, the voltage level of the output signal can be effectively reduced, but the amplitude of the output signal is also reduced at the same time. To address this issue, the test apparatus 100 relating to the present embodiment uses the differential amplifier 38 to amplify the difference between the voltage divided reference voltage and output signal, so as to be able to extract the amplitude component of the output signal.

Figure 4:
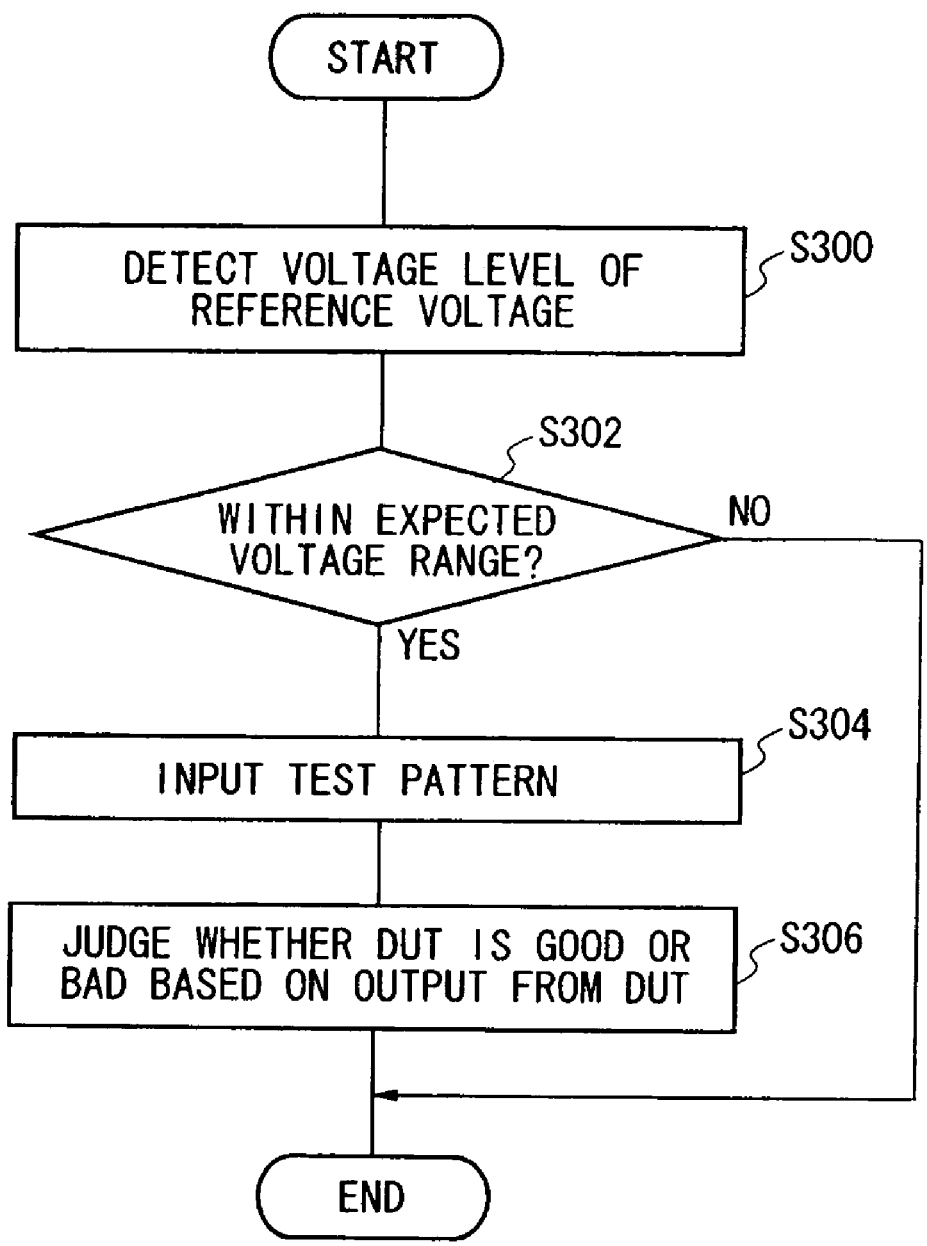
FIG. 4 is a flow chart showing an example of a test method relating to an embodiment of the present invention.

FIG. 4 is a flow chart showing an example of a test method relating to an embodiment of the present invention. The test method relating to the present embodiment may test the DUT 200 in the same or a similar method as/to the test apparatus 100 described with reference to FIG. 1.

To start with, the voltage level of a reference voltage supplied to the DUT 200 is detected in a voltage level detecting step S300. In the voltage level detecting step S300, the voltage level of the second reference voltage output from the reference voltage applying section 12 is detected. In the voltage level detecting step S300, the voltage levels of the voltages output from the floating power supply 14 and high voltage power supply 16 in the reference voltage applying section 12 may be detected respectively.

Following this, it is judged whether the voltage level of the reference voltage falls within the expected voltage range in a reference voltage judging step S302. As a result of this step, it can be judged whether the reference voltage applying section 12 operates normally. In the reference voltage judging step S302, if the high voltage power supply 16 is judged to operate normally, it may be further judged whether the floating power supply 14 operates normally. If the reference voltage applying section 12 is judged not to operate normally in the step S302, the process is terminated.

If the reference voltage applying section 12 is judged to operate normally, a test pattern is input into the DUT 200 and it is judged whether the DUT 200 is good or bad based on the output signal from the DUT 200 in the steps from S304 to S306. The above-described process can prevent a defective device from being erroneously judged as a good device when, for example, the reference voltage applying section 12 is broken.

Figure 5:
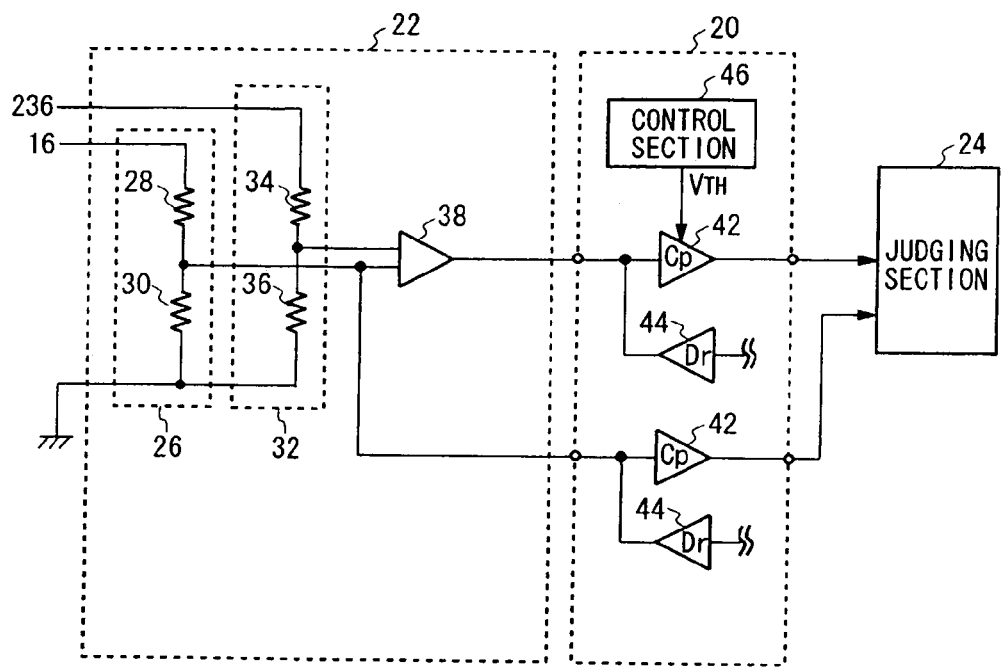
FIG. 5 shows another example of the configuration of the high voltage processing section 22.

FIG. 5 shows another example of the configuration of the high voltage processing section 22. The high voltage processing section 22 relating to the present embodiment has substantially the same configuration as the high voltage processing section 22 shown in FIG. 2, except for that the switching section 40 is not included. According to the present embodiment, the voltage divided reference voltage output from the reference voltage dividing section 26 is branched and input into the differential amplifier 38 and pin of the pin electronics section 20.

Referring to the pin electronics section 20, the comparator 42 into which the output of the differential amplifier 38 is input is different from the comparator 42 into which the output of the reference voltage dividing section 26 is input. The comparator 42 into which the output of the reference voltage dividing section 26 is input also functions as a voltage level detecting section similarly to the comparator 42 described with reference to FIG. 2.

When the high voltage processing section 22 and pin electronics section 20 are configured in the above-described manner, the judging section 24 can judge in real time whether the reference voltage applying section 12 normally operates, while the test apparatus 100 is testing the DUT 200 based on the output signal. Consequently, the test apparatus 100 relating to the present embodiment does not need to judge whether the reference voltage applying section 12 is good or bad before testing the DUT 200. This enables the test apparatus 100 to conduct the test efficiently.

Figure 6:
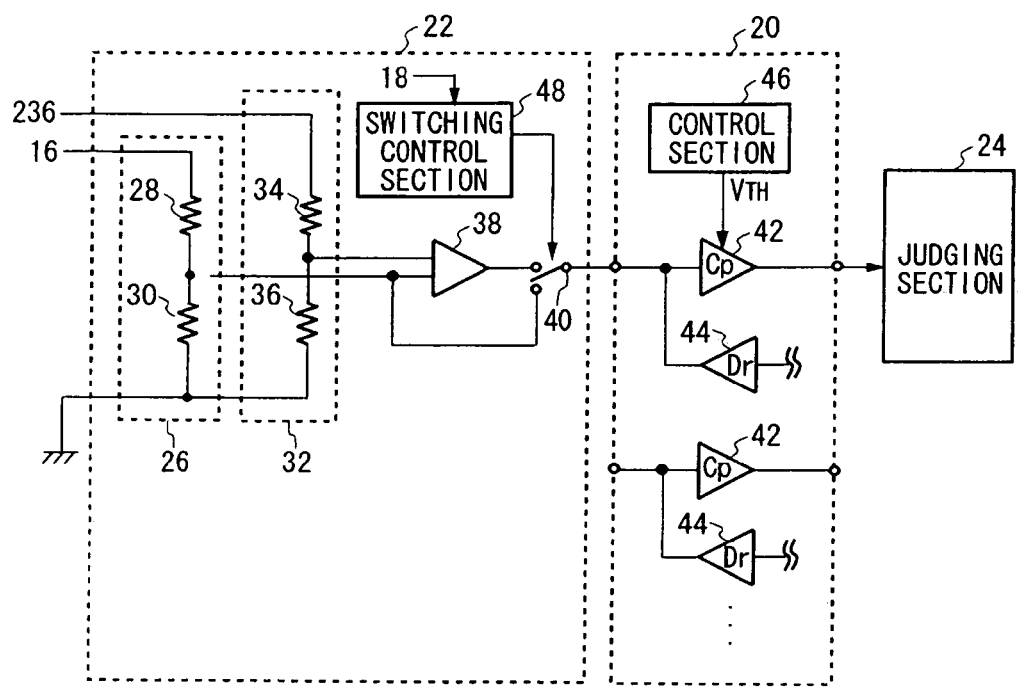
FIG. 6 shows another example of the configuration of the high voltage processing section 22.

FIG. 6 shows another example of the configuration of the high voltage processing section 22. The high voltage processing section 22 relating to the present embodiment includes therein a switching control section 48 in addition to the constituents of the high voltage processing section 22 described with reference to FIG. 2. The other constituents than the switching control section 48 have substantially the same functions and configurations as the corresponding constituents assigned the same reference numerals in FIG. 2.

The switching control section 48 controls the switching section 40 so that one of the output of the differential amplifier 38 and the output of the reference voltage dividing section 26 is input into the pin electronics section 20. For example, when the judging section 24 judges whether the reference voltage applying section 12 is good or bad before judging whether the DUT 200 is good or bad based on the output signal of the DUT 200 as illustrated in FIG. 4, the switching control section 48 controls the switching section 40 so as to input the second reference voltage into the comparator 42. If the second reference voltage falls within the expected voltage range, the switching control section 48 controls the switching section 40 so as to input the output of the differential amplifier 38 into the comparator 42.

The switching control section 48 may control the switching section 40 based on the test program supplied to the pattern generating section 18. For example, the switching control section 48 may detect, based on the test program, a timing at which the judging section 24 does not compare the output signal from the high voltage operating section 208 with the expected value signal, and at the detected timing, control the switching section 40 so as to input the second reference voltage into the comparator 42. The switching control section 48 may control the switching section 40 based on the expected value signal which is output from the pattern generating section 18 based on the test program. For example, the switching control section 48 may perform a control so that the second reference voltage is input into the comparator 42 when the pattern generating section 18 does not output the expected value signal. Alternatively, the switching control section 48 may perform a control so that the second reference voltage is input into the comparator 42 when the expected value signal indicates a null value.

When such a control is performed, it requires a single logic pin to judge whether the DUT 200 is good or bad and whether the reference voltage applying section 12 is good or bad. In addition, the judgment whether the reference voltage applying section 12 is good or bad can be made while the DUT 200 is being tested. As a consequence, the pin resource can be efficiently utilized, and the test can be efficiently performed.

The above-described embodiments enables a DUT to which a high voltage is supplied to be accurately tested.

While one aspect of the present invention has been described based on the embodiments of the present invention, the technical scope of the invention is not limited to the above described embodiments. It is apparent to persons skilled in the art that various alternations and improvements can be added to the above-described embodiment. It is also apparent from the scope of the claims that the embodiments added with such alternations or improvements can be included in the technical scope of the invention.

What is claimed is:

1. A test apparatus to test a device under test (DUT) including a low voltage operating section and a high voltage operating section that operates with a predetermined high voltage which is higher than that with which the low voltage operating section operates, the test apparatus comprising:

a low voltage applying section that applies a first reference voltage to the low voltage operating section of the DUT;

a high voltage applying section that applies, to the high voltage section of the DUT, a second reference voltage which has a higher voltage level than the first reference voltage by a predetermined difference, said second reference voltage defining a voltage level that is to be possessed by an output signal output from the DUT when the output signal indicates a predetermined logical value;

a voltage level detecting section that detects a voltage level of the second reference voltage;

a signal comparing section that compares the output signal with an expected value signal;

a reference voltage comparing section that judges whether the voltage level of the second reference voltage detected by the voltage level detecting section falls within a predetermined expected voltage range; and a judging section that judges whether the DUT is good or bad based on a result of the comparison done by the signal comparing section, under a condition that the voltage level of the second reference voltage falls within the expected voltage.

2. The test apparatus as set forth in claim 1, wherein the voltage level detecting section detects the voltage level of the second reference voltage based on an input terminal of the DUT into which the second reference voltage is input.

3. The test apparatus as set forth in claim 1, further comprising a plurality of logic pins that judge logical values of signals respectively input thereto, each of the plurality of logic pins including therein a comparator that compares a voltage level of the input signal with a threshold value supplied thereto and outputs a result of the comparison, wherein the high voltage operating section outputs the output signal which uses the second reference voltage as a reference, a first logic pin included in the plurality of logic pins is supplied with the output signal output from the high voltage operating section, a second logic pin included in the plurality of logic pins is supplied with the second reference voltage, and the test apparatus further comprises a control section that causes a comparator of the second logic pin to function as the voltage level detecting section by sequentially varying a threshold value supplied to the comparator of the second logic pin.

4. The test apparatus as set forth in claim 1, further comprising a switching section that switches an input into the voltage level detecting section between the output signal output from the high voltage operating section and the second reference voltage output from the reference voltage applying section.

5. The test apparatus as set forth in claim 4, further comprising:

a signal voltage dividing section that divides, with a predetermined voltage dividing ratio, a voltage level of the output signal output from the high voltage operating section;

a reference voltage dividing section that divides, with the voltage dividing ratio, the voltage level of the second reference voltage output from the reference voltage applying section; and a differential amplifier that amplifies, with an amplifying ratio determined in accordance with the voltage dividing ratio, a difference between the voltage level of the output signal output from the signal voltage dividing section and the voltage level of the second reference voltage output from the reference voltage dividing section and outputs a result of the amplification, wherein the switching section switches the input into the voltage level detecting section between a signal output from the differential amplifier and the second reference voltage output from the reference voltage dividing section.

6. The test apparatus as set forth in claim 4, further comprising a switching control section that (i) controls the switching section so as to input the second reference voltage into the voltage level detecting section, and (ii) when the reference voltage comparing section judges that the second reference voltage falls within the expected voltage range, controls the switching section so as to pass therethrough the output signal output from the high voltage operating section.

7. The test apparatus as set forth in claim 4, further comprising:

a pattern generating section that generates a test pattern to be input into the DUT based on a test program supplied thereto; and a switching control section that (i) detects, based on the test program, a timing at which the output signal from the high voltage operating section is not compared with the expected value signal, and (ii) at the detected timing, controls the second reference voltage so as to be input into the voltage level detecting section.

8. A test method for testing a device under test (DUT) including a low voltage operating section and a high voltage operating section that operates with a predetermined high voltage which is higher than that with which the low voltage operating section operates, the method comprising:

applying a first reference voltage to the low voltage operating section of the DUT;

applying, to the high voltage operating section of the DUT, a second reference voltage which has a higher voltage level than the first reference voltage by a predetermined difference, said second reference voltage defining a voltage level that is to be possessed by an output signal output from the DUT when the output signal indicates a predetermined logical value;

detecting a voltage level of the second reference voltage;

comparing the output signal with an expected value signal;

judging whether the voltage level of the second reference voltage falls within a predetermined expected voltage range; and judging whether the DUT is good or bad based on a result of the comparison done by said comparing, under a condition that the voltage level of the second reference voltage falls within the expected voltage range.

9. A test apparatus to test a device under test (DUT) including a Low voltage operating section and a high voltage operating section that operates with a predetermined high voltage which is higher than that with which the low voltage operating section operates, the test apparatus comprising:

a power supply generating a first reference voltage and connecting to an input of the low voltage operating section of the DUT through a first input/output pin of the DUT;

a high voltage applying section connecting to said power supply and generating a second reference voltage which has a higher voltage level than the first reference voltage by a predetermined difference, said high voltage applying section connecting to an input of the high voltage operating section of the DUT through a second input/output pin of the DUT;

a voltage level detecting section connecting to an output of the high voltage operating section of the DUT through a third input/output pin of the DUT, said voltage level detecting section judging whether the voltage level of the second reference voltage detected by the voltage level detecting section falls within a predetermined expected voltage range; and a signal judging section connecting to an output of said voltage level detecting section and comparing the output signal of said voltage level detecting section with an expected value, said signal judging section judging whether the DUT is good or bad based on a result of the comparison, under a condition that the voltage level of the second reference voltage falls within the expected voltage range.

* * * * *